(12) United States Patent
Kang et al.

(10) Patent No.: US 7,285,845 B2
(45) Date of Patent: Oct. 23, 2007

(54) LEAD FRAME FOR SEMICONDUCTOR PACKAGE

(75) Inventors: Sung-il Kang, Changwon-si (KR); Se-chuel Park, Changwon-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 69 days.

(21) Appl. No.: 11/194,285

(22) Filed: Aug. 1, 2005

(65) Prior Publication Data

US 2006/0231931 A1 Oct. 19, 2006

(30) Foreign Application Priority Data

Apr. 15, 2005 (KR) .................. 10-2005-0031420

(51) Int. Cl.
*H01L 23/495* (2006.01)
(52) U.S. Cl. .................. 257/666; 257/677; 257/736; 257/E23.054
(58) Field of Classification Search .......... 257/666, 257/677, 736
See application file for complete search history.

(56) References Cited

U.S. PATENT DOCUMENTS

| | | |
|---|---|---|
| 5,767,574 A | 6/1998 | Kim et al. |
| 5,801,436 A | 9/1998 | Serizawa |
| 5,958,607 A | 9/1999 | Kim et al. |
| 5,977,620 A | 11/1999 | Kim et al. |
| 5,994,767 A | 11/1999 | Huang et al. |
| 6,087,714 A | 7/2000 | Kubara et al. |
| 6,150,711 A | 11/2000 | Kom et al. |
| 6,150,713 A | 11/2000 | Park et al. |
| 6,469,386 B1 | 10/2002 | Lee et al. |
| 6,917,098 B1 * | 7/2005 | Yamunan .................. 257/666 |
| 2004/0140539 A1 * | 7/2004 | Abbott .................. 257/666 |

FOREIGN PATENT DOCUMENTS

| | | |
|---|---|---|
| JP | 59-168659 A | 9/1984 |
| JP | 05-315511 A | 11/1991 |
| JP | 10-321661 A | 12/1998 |
| JP | 2000-124361 A | 4/2000 |
| JP | 2002-246534 A | 8/2002 |

* cited by examiner

*Primary Examiner*—Nitin Parekh
(74) *Attorney, Agent, or Firm*—Drinker Biddle & Reath LLP

(57) ABSTRACT

A lead frame for a semiconductor package having not only high molding resin adhesiveness and a low delamination problem under a severe moisture absorbing atmosphere but also high interface adhesiveness and solder wettability of an Au wire, and a method of manufacturing the lead frame are provided. The lead frame includes a base metal layer formed of a metal and a plurality of plating layers having different components formed on at least a surface of the base metal layer, wherein the plating layers include, a Ni plating layer deposited on at least a surface of the base metal layer and formed of Ni or an Ni alloy, a Pd plating layer stacked on at least a surface of the Ni plating layer and formed of Pd or a Pd alloy, and a protection plating layer stacked on at least a surface of the Pd plating layer and formed of Au or an Au alloy, wherein the Ni plating layer is formed to have a predetermined a thickness and a surface coarseness.

20 Claims, 7 Drawing Sheets

| EMBODIMENT 1 | EMBODIMENT 2 | EMBODIMENT 2 | COMPARATIVE EXAMPLE 1 | COMPARATIVE EXAMPLE 1 |
|---|---|---|---|---|
|  |  |  |  |  |

301

LEAD FRAME FOR SEMICONDUCTOR PACKAGE

CROSS-REFERENCE TO RELATED PATENT APPLICATION

This application claims the benefit of Korean Patent Application No. 10-2005-0031420, filed on Apr. 15, 2005, in the Korean Intellectual Property Office, the disclosure of which is incorporated herein in its entirety by reference.

BACKGROUND OF THE INVENTION

1. Field of the Invention

The present invention relates to a lead frame for a semiconductor package having high molding compound adhesiveness.

2. Description of the Related Art

A lead frame together with a semiconductor chip constitutes a semiconductor package. The lead frame facilitates connection of the semiconductor package to an external terminal (e.g., a PCB) and also supports the semiconductor chip.

Figure 1:
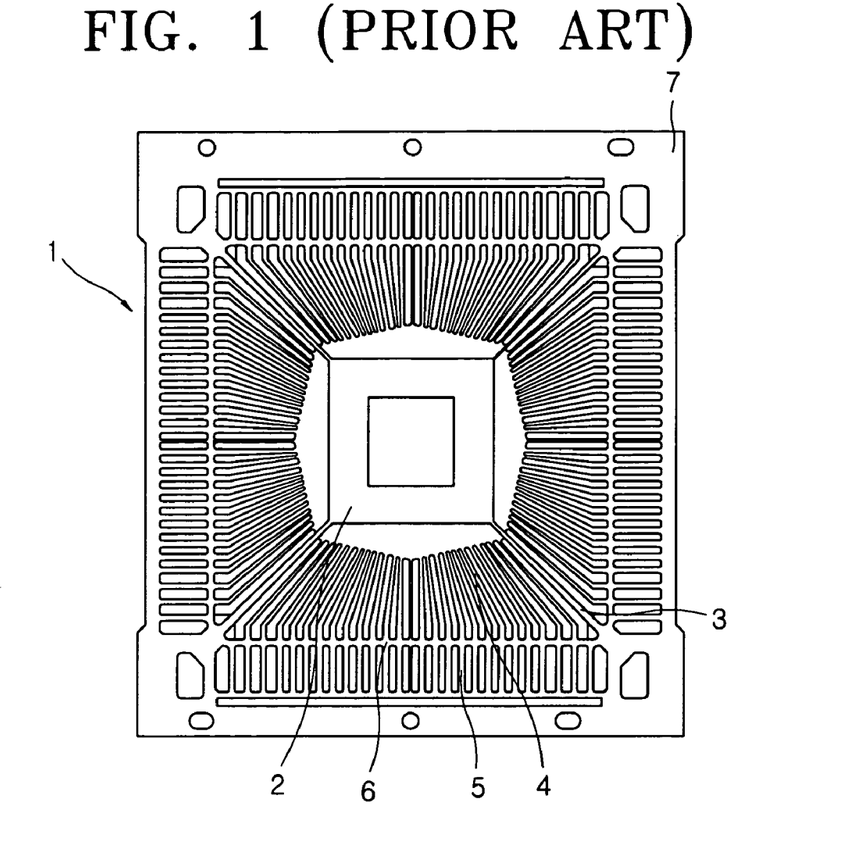
FIG. 1 is a plan view illustrating a typical lead frame for a semiconductor package.

FIG. 1 is a plan view illustrating a typical lead frame for a semiconductor package. Referring to FIG. 1, a lead frame 1 includes a die pad 2 and a plurality of leads connected thereto. The die pad 2 is connected to a pad supporting unit 3 by a rail 7 and supports a semiconductor chip (not shown).

The plurality of leads includes a plurality of inner leads 4 and a plurality of outer leads 5. A dam bar 6 that maintains a gap and supports the gap is formed between the inner leads 4 and the outer leads 5. The dam bar 6 and the rail 7 are removed after the assembling of the semiconductor package is completed.

A lead frame such as one having the above-described structure together with a semiconductor chip (e.g., a memory device) constitutes a semiconductor package through an assembling process. An example assembling process includes a die attaching process, a wire bonding process, and a molding process. The die attaching process is a process for attaching a semiconductor chip (die) to a pad of a lead frame, the wire bonding process is a process for connecting by bonding a terminal unit of a semiconductor chip to an inner lead of a lead frame using a metal, such as gold, and the molding process is a process for sealing a chip, wires, and inner leads using an insulating material, such as a molding resin, for example, epoxy molding compound (EMC).

To increase the adhesiveness of the semiconductor chip to the pad in the die attaching process and to improve the capability of bonding wires to the inner leads 4 in the wire bonding process, a metal having predetermined characteristics can be coated on the die pad 2 and the inner lead 4. Also, to improve the solder wettability of the outer leads 5 in the assembling process after the molding process, a soldering base can be plated on a predetermined portion of the outer leads 5 using, for example, a Tin-Lead (Sn—Pb) alloy.

However, the soldering base plating process is complicated and exposed Lead (Pb) and a Pb plating solution can cause an environmental problem. Also, a process for removing non-uniformity of the plating layer is required in the process of the soldering base plating. Also, the failure of a semiconductor chip occurs due to the penetration of the plating solution between a surface of the lead frame and the molding resin.

To solve the above problems, a pre-plated frame method has been proposed. In this method, the Pb plating process can be omitted in a subsequent process by pre-plating a material having high solder wettability on a metal upper layer before performing the semiconductor packaging process. A lead frame that has pre-plated using the pre-plated frame method draws attention due to a simple subsequent process and the reduced environmental problem by omitting Pb plating in the semiconductor packaging process.

Figure 2:
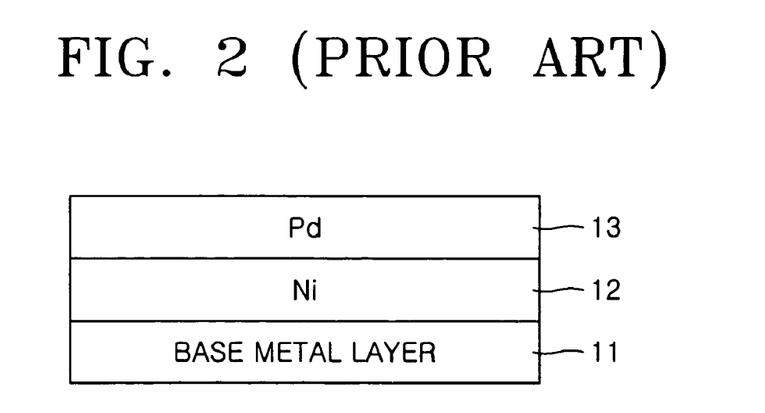
FIG. 2 is a cross-sectional diagrammatic view illustrating a structure of plating layers of a conventional lead frame for a semiconductor package.

FIG. 2 is a cross-sectional view illustrating an example of a lead frame manufactured using a conventional pre-plated frame method. Referring to FIG. 2, a Nickel (Ni) plating layer 12 is entirely formed on the base metal layer 11, which contains Cu as a main component, and a Palladium (Pd) plating layer 13 is directly formed on the Ni plating layer 12. That is, Ni and Pd are sequentially plated on the base metal layer 11.

When a lead frame having an uppermost Pd layer is used, an environmental problem of exposed Pb is avoided and a semiconductor packaging process can be simplified. However, due to heat generated from the semiconductor assembling process the Pd plating layer 13 forms an oxidized Pd compound, which may adversely affect physical properties (e.g., electrical conductivity, adhesiveness, etc.) of the Pd layer 13. In particular, oxidation of the Pd plating layer 13 reduces interface adhesiveness (wire bonding capability) and solder wettability between a gold wire and the lead frame. Also, when the Pd plating layer 13 absorbs hydrogen during plating, the Pd plating layer 13 becomes weakened/embrittled and made susceptible to cracking due to an impact.

Various lead frames to solve the foregoing problems have been proposed in U.S. Pat. No. 6,469,386. Two such lead frames are illustrated herein as FIGS. 3A and 3B. In one lead frame illustrated in FIG. 3A, a Ni plating layer 22, a Pd layer 23 and a Gold (Au) plating layer 24 are sequentially formed on a base metal layer 21. In another lead frame illustrated in FIG. 3B, a Ni or Ni alloy plating layer 22', a Pd or Pd alloy plating layer 23' and an Au—Pd alloy plating layer 24' are sequentially formed on the base metal layer 21. The structure of the plating layers 22, 23, 24 and 22', 23', 24' is substantially the same as the structure depicted in FIG. 2 with the addition of the uppermost Au plating layer 24 or the Au—Pd alloy plating layer 24'.

Figure 3A:
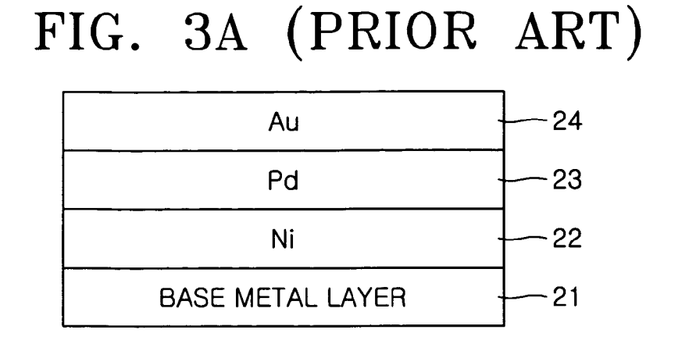
FIGS. 3A and 3B are cross-sectional diagrammatic views illustrating structures of plating layers of additional conventional lead frames for a semiconductor package.

The oxidation resistance of Au is greater than Pd. Therefore, as depicted in FIG. 3A, when a pure Au plating layer 24 is formed on the uppermost part pf a lead frame, the Au plating layer 24 prevents the Pd plating player 23 from being oxidized during a semiconductor packaging process in which a thermal process is performed, thereby solving the conventional low wire bonding capability and solder wettability problems.

However, disadvantageously, a molding resin generally has low affinity to a surface of a pure metal or alloy. Further, it is known that, in comparison to a surface of pure metal or alloy, when an oxide layer is formed on the surface of the pure metal or alloy, the adhesiveness of the molding resin is improved. Therefore, when a pure Au plating layer is formed on a contact surface of the molding resin as an oxidation preventing layer for Pd, the adhesiveness of the molding resin is reduced.

Figure 3B:
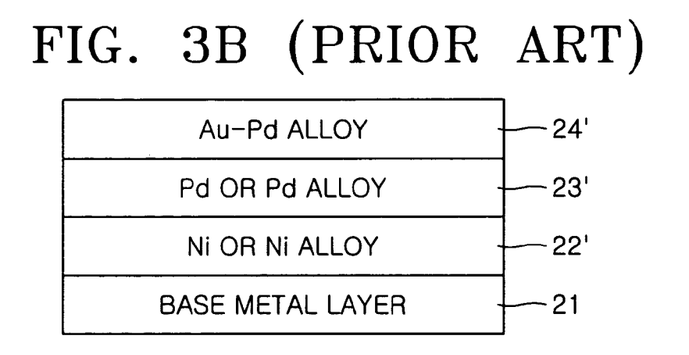

One known way to improve adhesiveness of the molding resin to the metal surface is depicted in FIG. 3B, when the Au—Pd alloy plating layer 24' composed of Au and Pd is formed on the Pd or Pd alloy plating layer 23', the adhesiveness between the molding resin and the Au—Pd alloy plating layer 24' is increased by the oxidation of exposed surface Pd portions.

Recently, the method of manufacturing an environment-friendly semiconductor package draws attention. To manufacture an environmental problem-free semiconductor package, high adhesiveness between a lead frame and the molding resin is required under a severe atmosphere in which temperature and humidity are very high. However, under the severe atmosphere, the Au—Pd alloy plating layer 24' has poor adhesiveness with the molding resin.

That is, as it will be described later, according to the result of a moisture sensitivity level (MSL) evaluation through a coupon test after passing 168 hours under an atmosphere of temperature of 85° C. and a relative humidity of 85%, the severe delamination of layers is observed and the adhesiveness of the molding resin is reduced. Therefore, the adhesiveness of the molding resin is degraded under a severe atmosphere, such as a high humidity condition.

SUMMARY OF THE INVENTION

The present invention provides a lead frame for a semiconductor package, the lead frame having: a low delamination problem and high molding resin adhesiveness, high interface adhesiveness; and solder wettability between an Au wire and a lead.

According to an aspect of the present invention, there is provided a lead frame for a semiconductor package including a base metal layer and a plurality of plating layers formed on the base metal layer, wherein the plurality of plating layers comprises: a Ni plating layer of Ni or an Ni alloy that is deposited on the base metal layer; a Pd plating layer of Pd or a Pd alloy that is stacked on the Ni plating layer; and a protection plating layer of Au or an Au alloy that is stacked on the Pd plating layer, wherein the Ni plating layer is formed to have a predetermined thickness and surface coarseness.

In one embodiment, the Ni plating layer may include a first Ni plating layer that is uniformly formed with a predetermined thickness on a surface of the base metal layer; and a second Ni plating layer that is roughly formed with a predetermined thickness and a surface coarseness on the first Ni plating layer.

In another embodiment, the Ni plating layer may include: a first Ni plating layer that is roughly formed with a predetermined thickness and a surface coarseness on the base metal layer; and a second Ni plating layer that is uniformly formed with a predetermined thickness on the first (i.e., rougher) Ni plating layer.

In yet another embodiment, the Ni plating layer may include a first Ni plating layer that is uniformly formed in a predetermined thickness on the base metal layer; a second (i.e., rougher) Ni plating layer that is roughly formed with a predetermined thickness and a surface coarseness on the first Ni plating layer; and a third Ni plating layer that is uniformly formed in a predetermined thickness on the second (i.e., rougher) Ni plating layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

The present invention will now be described more fully with reference to the accompanying drawings in which various embodiments of the invention are shown.

Figure 4:
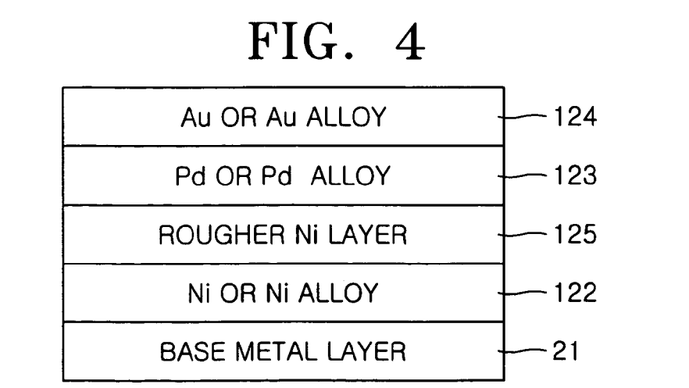
FIG. 4 is a cross-sectional diagrammatic view illustrating a structure of plating layers of a lead frame for a semiconductor package according to a first embodiment of the present invention.

FIG. 4 is a cross-sectional diagrammatic view illustrating a structure of plating layers of a lead frame for a semiconductor package according to a first embodiment of the present invention.

Referring to FIG. 4, a lead frame for a semiconductor package according to a first embodiment of the present invention comprises a base metal layer 21, a Ni plating layer 122, a rough Ni plating layer 125, a Pd plating layer 123 and a protection plating layer 124.

The base metal layer 21 is formed of Cu or alloy42 material as the main component, the Ni plating layer 122 is formed of Ni or a Ni alloy, the Pd plating layer 123 is formed of Pd or Pd alloy and the protection plating layer 124 is formed of Au or Au alloy.

The Ni plating layer 122 prevents the formation of a copper oxide or a copper sulfide by the diffusion of a material of the base metal layer 21, such as Cu, into a surface of the lead frame.

As known in the art, the Ni plating layers 122, 125 can be deposited by an electroplating process comprising application of a current density in the range of about 10-30 ampere/100 cm² (ASD) for 10-30 seconds while exposing the base metal layer 21 to a Ni solution that may include one or more of Ni, $H_3BO_3$, and Cl. An example thickness of the plating layers 122, 125 may be in the range of 10-50 micro inches.

In one example plating process, the rougher Ni plating layer 125 is formed on the first Ni plating layer 122 by electroplating using a high density current (e.g., greater than 10 ampere/100 cm²) that is applied to the base metal layer 21 after exposure to a chemical bath. The example chemical bath may include: nickel sulphate with a concentration of 30 g/l, ammonium sulphate with a concentration of 30 g/l, sodium sulphate with a concentration of 50 g/l, sodium chloride with a concentration of 20 g/l, and boric acid with a concentration of 25 g/l. In another example plating process, plating can be performed in a reel-to-reel type process in which a semiconductor lead frame that is wound around a roller on a side is supplied, and when the plating is completed, the semiconductor lead frame is wound around the other side of the roller. To increase the plating speed and to obtain a rougher Ni alloy layer stably, a higher current, such as 50 ASD, can be applied. The plating time is in the range of about 5-20 seconds. If the plating time is less than 5 second, securing a rougher Ni alloy layer having an appropriate thickness is difficult, whereas, if the plating time is more than 20 seconds, a contamination of the Ni plating layer can occur.

Typically, Pd or a Pd alloy has high solder wettability. Therefore, the Pd plating layer 123 is formed on the rougher Ni plating layer 125 and functions to protect a surface of the rougher Ni plating layer 125 and facilitates soldering.

The protection plating layer 124, which is formed of Au or an Au alloy, prevents the Pd plating layer 123 from absorbing hydrogen when exposed to air. That is, the protection plating layer 124 prevents the lead frame 1 (FIG. 1) from having reduced solder wettability by preventing the oxidation of the Pd plating layer 123 while the lead frame undergoes a thermal process when a semiconductor package is manufactured.

The thickness of the Ni plating layer 122 is in the range of about 10-50 micro inches, the thickness of the rougher Ni plating layer 125 is in the range of about 1-10 micro inches and the thickness of the Pd plating layer 123 is in the range of about 0.2-1.0 micro inches. The protection plating layer 124 is formed by flash plating. If the protection plating layer 124 is formed too thin, maintenance cost increases, and if the protection plating layer 124 is formed too thick, the manufacturing cost may excessively increase since the consumption of expensive Au is increased. Therefore, an appropriate thickness must be maintained.

As described above, when plating is deposited on a surface of a lead frame, the adhesiveness between the lead frame and a molding resin is remarkably increased. A method to further increase the adhesiveness between the molding resin and the lead frame by plating an outermost surface of the lead frame with a material having high adhesiveness with the molding resin has been used. However, as will be further illustrated hereinafter, the adhesiveness between the molding resin and the lead frame can be increased by forming a plating layer having a rough surface. Accordingly, a material having a slightly lower adhesiveness with a molding resin can be used as a material to form the protection plating layer 124 if the material has other advantages, such as high Pb wettability or low costs, since the adhesiveness between the molding resin and the lead frame is remarkably improved by the rougher plating layer. For example, in some aspects, silver (Ag) may be employed for the protection plating layer 124. Thus, other characteristics of the lead frame, such as low material costs or high Pb wettability, can be strengthened since the selectivity range of a material that constitutes the lead frame is increased.

Figure 5:
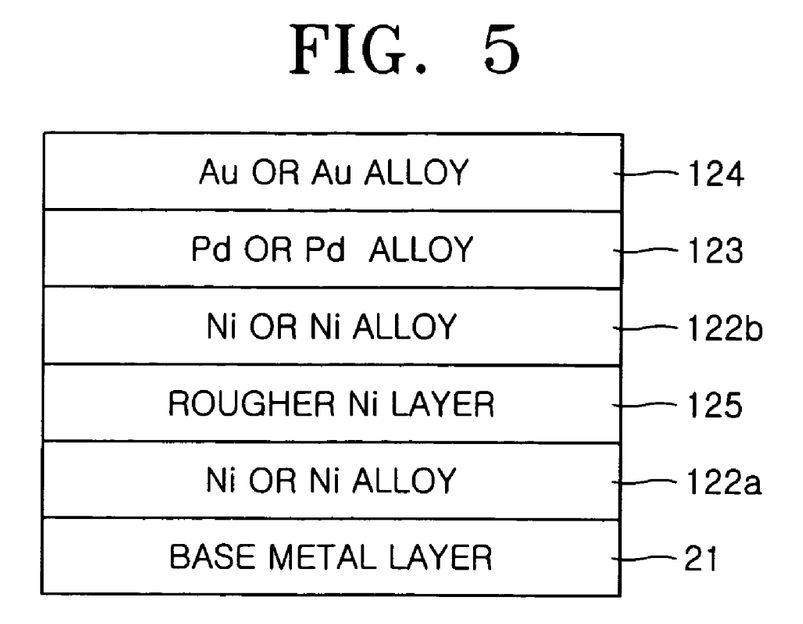
FIG. 5 is a cross-sectional diagrammatic view illustrating a structure of plating layers of a lead frame for a semiconductor package according to a second embodiment of the present invention.

FIG. 5 is a cross-sectional diagrammatic view illustrating a structure of plating layers of a lead frame for a semiconductor package according to a second embodiment of the present invention.

Referring to FIG. 5, a lead frame according to the second embodiment includes a base metal layer 21, a first Ni plating layer 122a, a second (rougher) Ni plating layer 125, a third Ni plating layer 122b, a Pd plating layer 123 and a protection plating layer 124.

The difference between the present embodiment and the previous embodiment is that the Ni plating layers 122a and 122b are sandwiching the rougher Ni plating layer 125. The thicknesses of the Ni plating layers 122a, 122b may be in the range of about 10-50 micro inches and the thickness of the Ni plating layer 125 may be in the range of about 1-10 micro inches.

Figure 6:
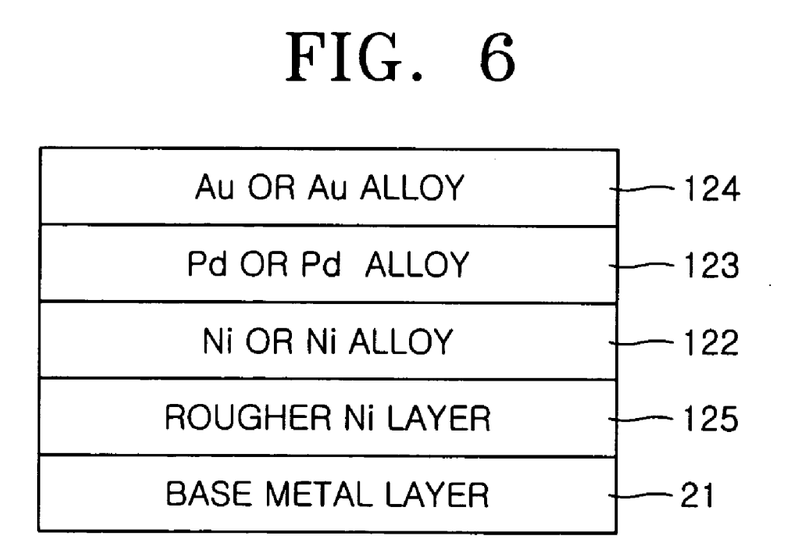
FIG. 6 is a cross-sectional diagrammatic view illustrating a structure of plating layers of a lead frame for a semiconductor package according to a third embodiment of the present invention.

FIG. 6 is a cross-sectional diagrammatic view illustrating a structure of plating layers of a lead frame for a semiconductor package according to a third embodiment of the present invention.

Referring to FIG. 6, a lead frame for a semiconductor package according to the present embodiment includes a base metal layer 21, a first (rougher) Ni plating layer 125, a second Ni plating layer 122, a Pd plating layer 123 and a protection plating layer 124.

The difference between the present embodiment and the first embodiment illustrated in FIG. 4 is that the location of the rougher Ni plating layer 125 and the Ni plating layer 122 are exchanged.

As can be appreciated from FIGS. 4-6 and the foregoing description, a lead frame having physically superior adhesiveness can be manufactured by forming a surface of the lead frame by including a rougher Ni plating layer 125 in the plating layers.

Figure 7:
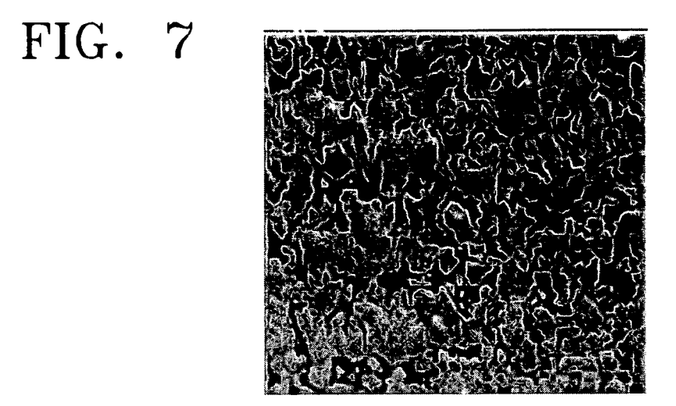
FIGS. 7 through 9 respectively illustrate surfaces of lead frames including plating layer structures according to FIGS. 4 through 6.
Figure 8:
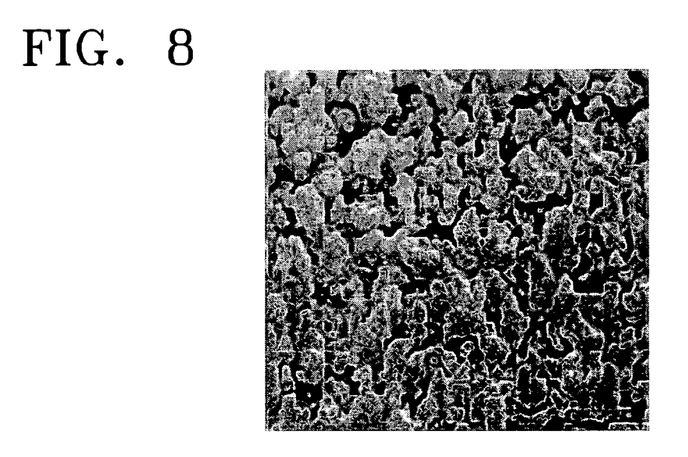
Figure 9:
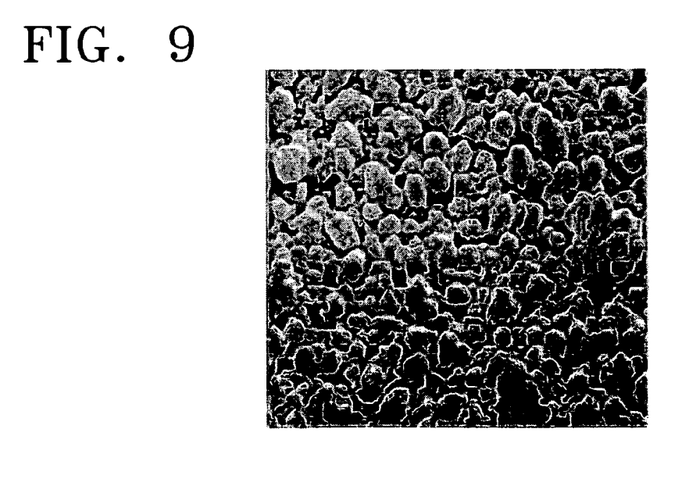
Figure 10:
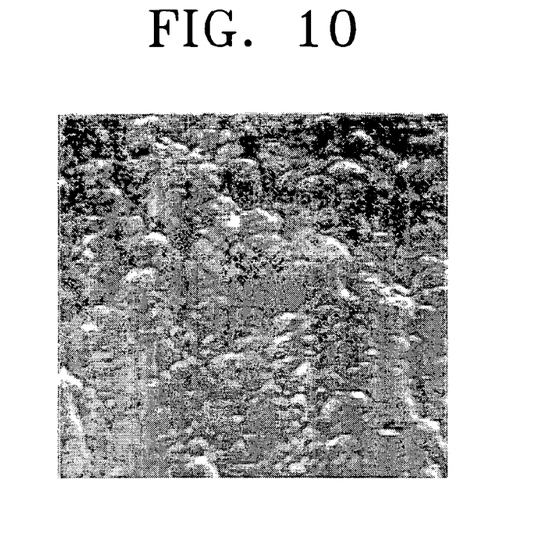
FIG. 10 illustrates a surface of the conventional lead frame depicted in FIG. 2.

FIGS. 7 through 9 respectively illustrate surfaces of the lead frames according to FIGS. 4 through 6 of the present invention. FIG. 10 illustrates a surface of the conventional lead frame for a semiconductor package that is depicted in FIG. 2.

By comparing FIG. 2 to FIGS. 7-9, surfaces of lead frames according to the embodiments of the present invention have a rougher surface than the surface of a conventional lead frame. Thus, the adhesiveness between the molding resin and the lead frame is increased through the addition of a binding/friction force from the roughness of the lead frame surface after the molding resin is bonded.

After a lead frame according to the embodiments of the present invention is manufactured, the surface roughness of the lead frame can be checked by a scanning electron microscope (SEM). However, checking surface roughness using the SEM takes time and is difficult to perform simultaneously with the plating process. Therefore, there is a need to develop a method to rapidly check the surface roughness while the plating process is proceeding. Therefore, for this purpose, a gloss measuring method known in the art can be used. When the measured gloss lies in a range of 0.2-0.8, the lead frame is considered as having a desired surface roughness. If the gloss is less than 0.2, the surface roughness is too high and a resin, for example, an Ag epoxy, can spread out during molding and result a resin bleed overflow (RBO) which causes a quality problem. If the gloss is more than 0.8, the surface roughness is not enough and the increase in the moisture sensitivity level (MSL) is not effective.

An aspect of the present invention through comparative examples will now be described in detail. The present invention is not limited to the following comparative examples.

Figure 11:
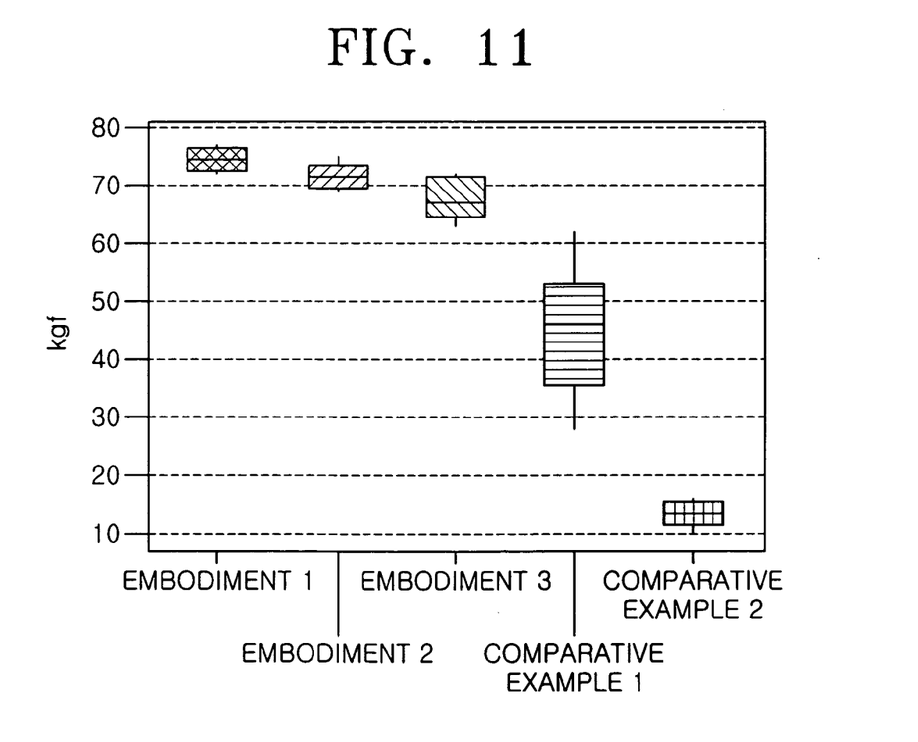
FIG. 11 is a graph showing adhesiveness test results from a coupon test performed on the embodiments of the present invention and comparative examples.
Figure 12:
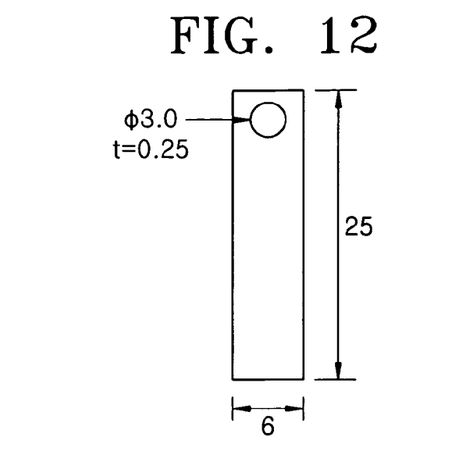
FIGS. 12 through 14 illustrate specimens used for the coupon test.
Figure 13:
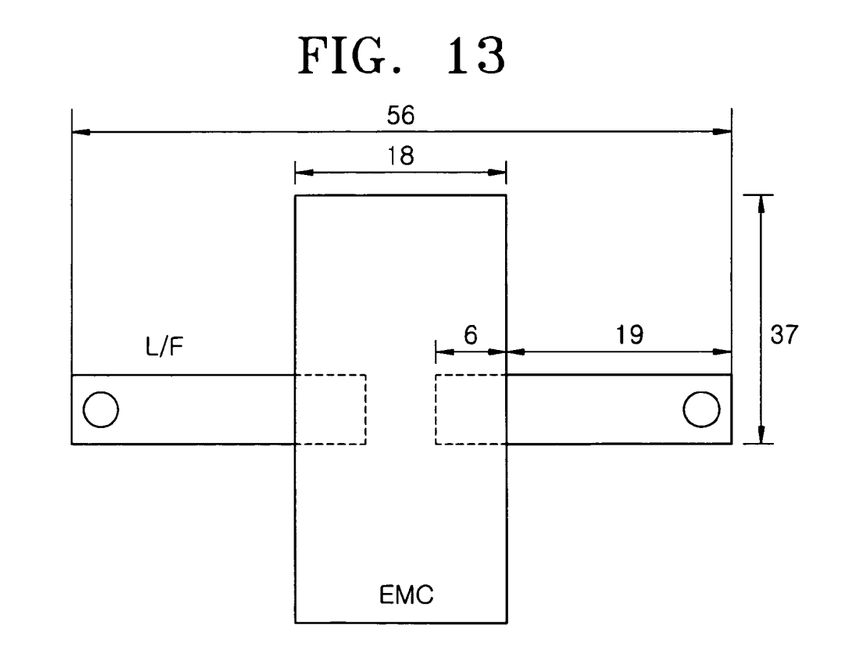
Figure 14:
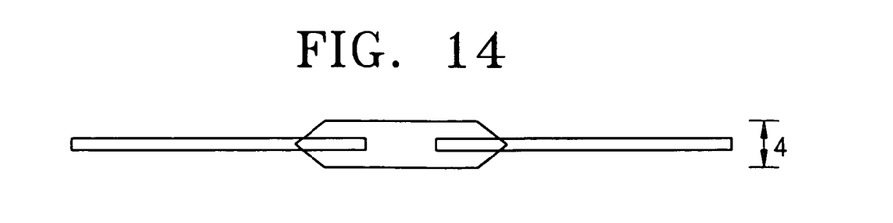
Figure 15:
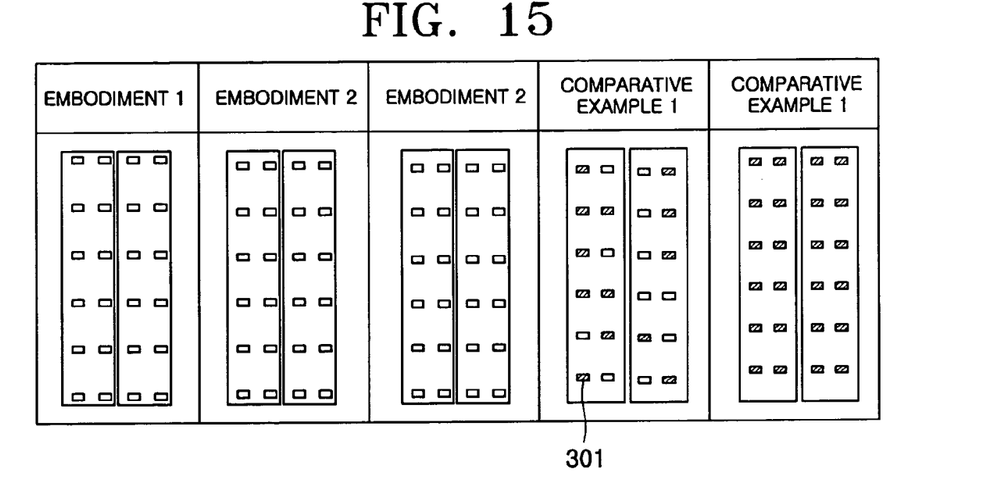
FIG. 15 is a table comparing delamination of the present invention with delamination of the comparative examples.

FIG. 11 is a graph showing molding shear forces based on data obtained by performing a coupon test on various semiconductor packages for comparing lead frames according to embodiments of the present invention with another comparison embodiment. FIGS. 12 through 14 illustrate shapes and dimensions of semiconductor package specimens and leads/pins thereof that are subjected to the coupon test. FIG. 15 is a table showing the degree of delamination of a molding resin of the semiconductor package specimens resulting from the coupon tests. Here, the degree of delamination denotes the degree of separation of the molding resin from the lead frame from an entire possible contact area between the molding resin and the lead frame after the following test conditions are applied, that is, after a moisture absorption process and a reflow are performed.

Specimens and test conditions are as follows.
1. Specimens
   (1) Lead frames:
      1-3) Embodiments 1, 2 and 3 are semiconductor packages that include a lead frame having plating layers according to FIGS. 4 through 6, respectively. Each semiconductor package lead/pin has a thickness of 0.25 nm, a width of 6 mm and a length of 25 mm and wherein the base metal layer of the lead frame is formed mainly of Cu.
      4) Comparative example 1 is a semiconductor package similar to the above-described embodiment 1 except for having a lead frame with a substantially rougher Ni plating layer and lacking a protection plating layer.
      5) Comparative example 2 is a semiconductor package similar to the above-described comparative example 1 except having a protection plating layer of Au.
   (2) Molding resin: Model SL 7300MES (MQFP type), available from Cheil Industries Inc. of Seoul, Korea, is used.
   (3) Specimens are manufactured to all be the same size depicted in FIGS. 12 through 14 using the foregoing lead frames and the molding resin.
2. Test conditions
   (1) Mold pre-curing: at a temperature of 175° C. for 4 hours;
   (2) Moisture absorption process: at a temperature of 85° C. for 168 hours and relative humidity of 85%; and
   (3) Reflow: after sequentially performing at the maximum temperature of 260° C. (three times), the adhesiveness of the specimens is measured.
3. Test apparatus
   (1) Scanning Acoustic Microscope (SAM): Model HS-100 (SONIX Co.)
   (2) Strength tester: Model AGS-100A (Shimadzu Co.)

Referring now to FIG. 11, the semiconductor packages having lead frames according to FIGS. 4 through 6 of the present invention have a molding resin adhesiveness of greater than 75 kgf, 70 kgf, and 64 kgf, respectively. As can be appreciated, the molding resin adhesivenesses are much greater than what is required for maintaining the reliability of a semiconductor package as known in the art.

However, in the case of the comparative example 1, the molding resin adhesiveness is found to be in the range of about 35-53 kgf, and that the molding resin adhesiveness of the comparative example 2 is found to be in the range of about 12-15 kgf. That is, the molding resin adhesiveness of the lead frame that includes a rougher Ni plating layer is remarkably greater than that of the comparative examples 1 and 2.

Referring to FIG. 15, when the bonding states between the molding resin and the lead frame after applying the above test conditions which are severer than the actual using conditions without directly applying a force, is investigated, delamination is hardly generated in the cases of the present embodiments of the present invention. The hatched portions (e.g., portion 301 of comparative example 1) shown in FIG. 15 are delaminated portions. However, in the case of the comparative example 1, the delamination (e.g., hatched portions 301) is generated in more than half of the entire area and, in the case of the comparative example 2, the delamination (e.g., hatched portions 301) is generated in most areas.

As can be appreciated from FIG. 15, a lead frame having a rougher Ni plating layer has a remarkably lower delamination degree compared to the comparative examples 1 and 2.

As described above, a lead frame for a semiconductor package according to the present invention can improve not only the wire bonding capability and solder wettability which are quality targets of the lead frame, but also the molding resin adhesiveness and delamination problem, thereby improving the reliability of a semiconductor package.

Also, the lead frame according to the present invention is suitable for manufacturing an environmentally-friendly semiconductor package, i.e., a Pb free semiconductor package, since the lead frame has high molding resin adhesiveness and low delamination problem even under a severe moisture absorbing atmosphere.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A lead frame for a semiconductor package comprising:
   a base metal layer;
   a first Ni plating layer on the base metal layer, the first Ni plating layer having a first thickness and a first surface coarseness;
   a second Ni plating layer on the first Ni plating layer, the second Ni plating layer having a second thickness and a second surface coarseness substantially greater than the first surface coarseness;
   a Pd plating layer on the second Ni plating layer; and
   a protection plating layer on the Pd plating layer.

2. The lead frame of claim 1 wherein the protection plating layer comprises Au or an Au alloy.

3. The lead frame of claim 1 wherein the first thickness is in the range of about 10-50 micro inches.

4. The lead frame of claim 3 wherein the second thickness is in the range of about 1.0-10 micro inches.

5. The lead frame of claim 1 wherein the second thickness is in the range of about 1.0-10 micro inches.

6. The lead frame of claim 5 wherein the first thickness is in the range of about 10-50 micro inches.

7. The lead frame of claim 1 wherein the second thickness is in the range of about 10-50 micro inches.

8. The lead frame of claim 7 wherein the first thickness is in the range of about 1.0-10 micro inches.

9. The lead frame of claim 1 wherein the base metal layer comprises one of Cu and alloy42.

10. The lead frame of claim 1 wherein the Pd plating layer has a thickness in the range of about 0.2-1.0 micro inches.

11. The lead frame of claim 1 wherein the protection plating layer comprises a flash plating.

12. The lead frame of claim 1 wherein one of the first surface coarseness and the second surface coarseness provides a surface gloss in the range of about 0.2-0.8 on the protection plating layer.

13. A lead frame comprising:
a base metal layer;
a first Ni plating layer on the base metal layer, the first Ni plating layer having a first thickness and a first surface coarseness;
a second Ni plating layer on the first Ni plating layer, the second Ni plating layer having a second thickness and a second surface coarseness;
a Pd plating layer on the second Ni plating layer;
a protection plating layer on the Pd plating layer; and
a third Ni plating layer disposed between the second Ni plating layer and the Pd plating layer, wherein the third Ni plating layer has a third thickness and a third surface coarseness wherein the third surface coarseness is different than the first or the second surface coarseness.

14. The lead frame of claim 13 where second surface coarseness is substantially greater than the first surface coarseness and the third surface coarseness.

15. The lead frame of claim 14 wherein the third thickness is in the range of about 1.0-10 micro inches.

16. The lead frame of claim 15 wherein the first thickness is in the range of about 10-50 micro inches.

17. The lead frame of claim 13 wherein the second thickness is in the range of about 1.0-10 micro inches.

18. The lead frame of claim 13 wherein the base metal layer comprises one of Cu and alloy42.

19. The lead frame of claim 13 wherein the third thickness is in the range of about 10-50 micro inches.

20. The lead frame of claim 13 wherein the second thickness is in the range of about 10-50 micro inches.

* * * * *